US007088148B2

(12) United States Patent
Devendorf et al.

(10) Patent No.: US 7,088,148 B2
(45) Date of Patent: Aug. 8, 2006

(54) SAMPLE AND HOLD CIRCUIT AND BOOTSTRAPPING CIRCUITS THEREFOR

(75) Inventors: Don C. Devendorf, Carlsbad, CA (US); Lloyd F. Linder, Agoura Hills, CA (US); Kelvin T. Tran, Torrance, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 16 days.

(21) Appl. No.: 10/863,561

(22) Filed: Jun. 8, 2004

(65) Prior Publication Data

US 2005/0035791 A1    Feb. 17, 2005

Related U.S. Application Data

(60) Provisional application No. 60/495,766, filed on Aug. 14, 2003.

(51) Int. Cl.
    *G11C 27/02* (2006.01)
(52) U.S. Cl. ......................................................... 327/94
(58) Field of Classification Search .................. 327/91, 327/94–96
    See application file for complete search history.

(56) References Cited

U.S. PATENT DOCUMENTS

| 5,378,938 | A | * | 1/1995 | Birdsall et al. | ............... 327/94 |
| 6,144,234 | A | * | 11/2000 | Nakamura | .................... 327/94 |
| 6,489,814 | B1 | * | 12/2002 | Hoogzaad et al. | ............ 327/94 |

* cited by examiner

*Primary Examiner*—My-Trang Nu Ton
(74) *Attorney, Agent, or Firm*—Morrison & Foerster LLP

(57) ABSTRACT

A sample and hold circuit including a first arrangement for receiving an input signal; a second arrangement for sampling and holding the signal in response to a control signal; and a third arrangement for minimizing the change in an input transistor's base current when the circuit switches from track to hold or hold to track and for keeping the collector emitter voltage constant at the input transistor. An arrangement is disclosed to increase the dynamic current accuracy of a current mirror for a diode connected transistor, by holding the voltage across one transistor in the current mirror constant. Another arrangement is disclosed for holding collector to emitter voltage constant for intermediate transistors resulting in improved gain accuracy and linearity. In one embodiment, a dummy leg is added to isolate the output voltage from switching transients that occur when an intermediate transistor is turned on at the transition from track to hold.

12 Claims, 7 Drawing Sheets

FEED FORWARD
BOOT STRAPPING

FEED BACK
BOOT STRAPPING

FEED FORWARD
WITH ROLL-OFF

OPEN LOOP
FEEDFORWARD
NO DUMMY LEG

OPEN LOOP BOOTSTRAPPING
WITH DUMMY LEG $Q_1$ & $Q_2$

SAMPLE AND HOLD CIRCUIT AND BOOTSTRAPPING CIRCUITS THEREFOR

CROSS-REFERENCE TO RELATED APPLICATIONS

This application claims the benefit of U.S. Provisional Application No. 60/495,766, filed Aug. 14, 2003, the disclosure of which is hereby incorporated by reference.

BACKGROUND OF THE INVENTION

1. Field of the Invention

The present invention relates to electrical and electronic circuits and systems. More specifically, the present invention relates to sample and hold circuits.

2. Description of the Related Art

Sample and hold (S&H) circuits are well-known in the art. S&H circuits store, on command, the instantaneous amplitude of an input signal. S&H circuits are used in a variety of applications including high-speed Analog to Digital Converters (ADCs). If an ADC was perfect, then all errors associated with the conversion might be presumed to be caused by the S&H. In reality, often the S&H performance is the limiting factor with respect to the overall ADC system performance. Therefore, it is important to optimize the S&H performance with respect to speed, accuracy, linearity and lack of distortion.

There are several shortcomings associated with conventional S&H circuits. First, switching transients tend to degrade the performance of conventional S&H circuits. Second, the need to limit input voltage swings to avoid overdriving internal circuits tends to limit the dynamic range of the circuit. Third, undesirable variations in gain, as a function of input voltage may cause, a nonlinearity over the input voltage range. Fourth, variations in input voltage may cause other distortions and limit the dynamic range of the S&H.

Hence, a need exists in the art for an improved sample and hold circuit for analog-to-digital converters and other applications.

SUMMARY OF THE INVENTION

The need in the art is addressed by the teachings of the present invention. In an illustrative embodiment, the teachings are embodied in a sample and hold circuit which is improved relative to the prior art. In an illustrative embodiment, the inventive sample, and hold circuit includes a first arrangement for receiving an input signal; a second arrangement for sampling and holding the signal in response to a control signal; and a third arrangement for minimizing a change in an input transistor's base current when the circuit switches from track to hold or hold to track. This offers improvements in settling time as current transients on an input terminal will not impact any driving circuit, such as a bandpass filter. In addition, it should increase the hold mode isolation thereby increasing the input dynamic range allowing distortion-free operation over a larger input negative voltage swing than per the designs of the prior art.

One feature is designed to hold the collector emitter (VCE) voltage constant at the input transistor. This should improve gain accuracy and linearity over the prior art where collector-emitter voltages are allowed to vary.

Another feature is designed to increase the dynamic current accuracy of a current mirror (M1 and M2) for a diode connected transistor QK, by holding M2's source to drain voltage, $V_{SD}$, constant. This should keep the current in a current source constant so that it does not vary as a function of the input voltage thereby modulating the input signal. This should improve the accuracy and linearity of the sample and hold over the teachings of the prior art.

Yet another feature is designed to hold $V_{CE}$ constant for intermediate transistors (QF and QG below) resulting in improved gain accuracy and linearity. In one embodiment, a dummy leg is added to isolate the output voltage, $V_{OUT}$, from switching transients that occur when an intermediate transistor (QH) is turned on at the transition from track to hold.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
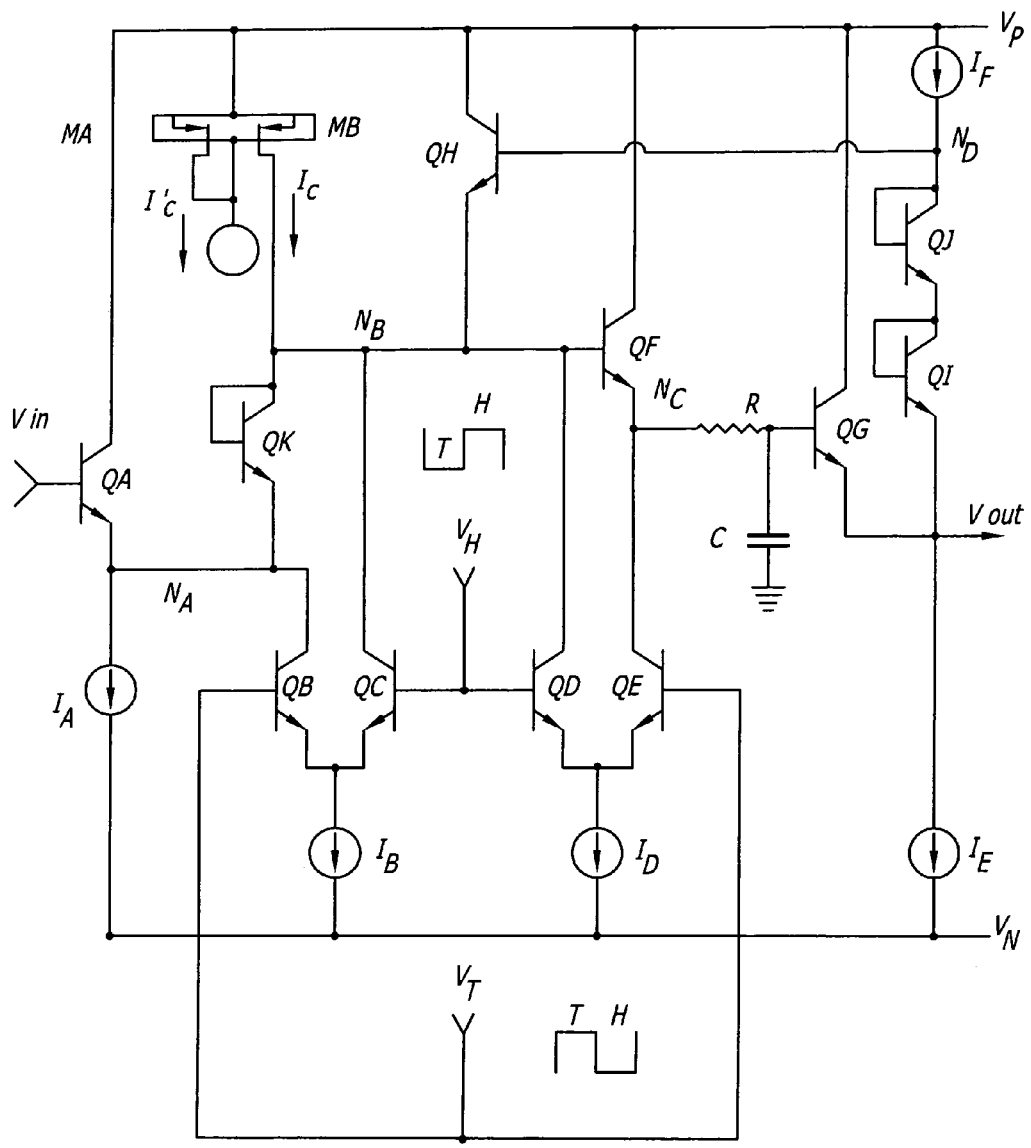
FIG. 1 is a typical implementation of a sample and hold circuit implemented in accordance with conventional teachings.

FIG. 1 is a typical implementation of a sample and hold (aka 'track and hold' circuit 10' implemented in accordance with conventional teachings. In the present application, the terms 'sample' and 'track' are used interchangeably. In a track mode, $V_T$ is high and $V_H$ is low. Therefore QB and QE are conducting (on) and QC and QD are not conducting (off). For now, assume, for each transistor, that the base emitter threshold voltage $V_{BE}=0.8V$ to gain an understanding of the circuit's basic operation. If the input voltage is, $V_{IN}$, then the voltage at Node A $(VN_A)=V_{IN}-0.8V$, $VN_B=V_{IN}$, $VN_C=V_{IN}-0.8V$, and capacitor, C, is charged to the voltage $VN_{IN}-0.8V$. $V_{OUT}=V_{IN}-1.6$ V, $VN_D=V_{IN}$. Since $VN_B=VN_D$, transistor, QH, is off and $V_{OUT}=V_{IN}$ with an offset of −1.6 Volts. Now, when the S&H 10' switches to the hold mode, QB and QE are turned off and QC and QD are turned on. When QC and QD are turned on, QH is turned on and VNB is pulled down to $VN_D-VB_E(QH)$. Since $VN_C=VN_D-VB_{BE}$ and QH is turned on ($V_{BE}$'s are equal), $VN_B=VN_C$. QF is therefore turned off and the voltage at Node $N_C$ is held constant by capacitors C. Since QF is off, the output voltage is independent of the input voltage, $V_{IN}$.

Problem 1a. When transitioning from track to hold, QB is switched from on to off. In track, the collector current of QA $(I(QA))$ equals $I_A-I_C+I_B$. In hold, $I(QA)=I_A$ since QB is off and diode connected transistor QK is back biased (off). Therefore, when switching from track to hold or hold to track there is a change in the collector current in QA $(\Delta I(QA))$. $\Delta I(QA)=[I_A-I_C+I_B]-I_A=I_B-I_C$. This change in collector current will result in a change to the input base current of QA. This $\Delta I_B(QA)$ will impact the input drive circuit. In many cases the drive circuit (not shown) is a narrow band bandpass filter. Base current-transients will settle with a long-time constant due to the bandwidth of the filter. This transient will degrade the dynamic performance of the S&H.

Problem 1b. A second problem occurs due to the typical prior need to limit the input voltage swing. In the hold mode, if we capture a positive full scale input at Node $N_C$ we have, for $V_{IN}=V_{CM}+/-V_{FS}$, $VN_C=V_{CM}+V_{FS}-V_{BE}$. While we are holding this value, assume the input swings to negative full-scale, $V_{IN}=V_{CM}-V_{FS}$. The diode connected transistor QK must not turn on when in the hold mode otherwise input transistor QA would begin to turn off causing both circuit speed and settling problems since QA would no longer be operating in a linear mode. It would also cause an input current transient with the problems discussed above. To avoid turning on the diode, we need to limit the input voltage swing to +/−0.4 V which is shown by the following analysis.

For the case where we are holding the largest positive input, and the input goes to the smallest negative input, we want $VN_B-VN_A=VN_B-(V_{CM}-V_{BE}-V_{FS})<V_{BE}(QK)$ so the diode connected transistor QK does not conduct. Since $VN_B=VN_C$ we have (while holding largest positive swing) $V_{CM}+V_{FS}-V_{BE}-(V_{CM}-V_{BE}-V_{FS})<V_{BE}(QK)$ or $2V_{FS}<V_{BE}$ (QK) or $2V_{FS}<0.8V$. So we need $V_{FS}<0.4V$. This means that the input can vary from $V_{CM}+0.4$ to $V_{CM}-0.4$ or a swing of +/−0.4V. This limit on the input voltage range makes extending the dynamic range of the circuit very difficult as the least significant bit (LSB) of the converter would have to go to $0.8V/2^{14}=0.0488$ mV for a 14 bit ADC. Whereas, if the input voltage range were allowed to extend to +/−2.048 V, the LSB size would increase to 0.25 mV.

Problem 2. In the track mode, as $V_{IN}$ varies, the collector voltage of QA, $V_{CE}(QA)$, will vary since the collector is tied to $V_P$. $V_{CE}(QA)=V_P-(V_{IN}-0.8V)$. Since $V_{CE}(QA)$ varies as a function of $V_{IN}$, the gain of QA will vary. This causes a non-linearity due to the Early effect in QA as $V_{IN}$ varies over its input range. The Early effect accounts for the fact that a bi-polar junction transistors collector current will vary as a function of the collector-emmiter voltage. This is due to a decrease in the effective base width as the collector-base reverse bias increases. An equation commonly used to account for the Early effect's impact on collector current is: ic=Ixe VEE/VT [1+VCE over VA] where the term VA is the Early voltage. A similar effect occurs in FETs and is often referred to as 'channel length modulation'.

Problem 3. As $V_{IN}$ varies so does $VN_B$ since $V_{IN}=VN_B$. If we define the voltage across the current source (implemented as current mirror MA&MB) $I_C$ as $V_{SD}(MB)$ (source-to-drain voltage across MB), we find that $V_{SD}(MB)=V_P-VN_B$ and since, as described earlier, $VN_B=V_{IN}$, we see that $V_{SD}(MB)=V_P-V_{IN}$. This means that the voltage across the current source for $I_C$ varies as a function of $V_{IN}$. With the voltage varying across the current source for $I_C$, the current being sourced will also vary since the output impedance is not infinite. With $I_C$ varying as a function of $V_{IN}$, the voltage drop across QK and $V_{BE}(QA)$ will also vary. This will cause distortion and limit the dynamic range of the S&H.

Problem 4. This problem is similar to that described in Problem 2. The voltage between the collector and emitter of QF and QG will vary as a function of $V_{IN}$. $V_{CE}(QF)=V_P-VN_C$ and $V_{CE}(QG)=V_P-V_{OUT}$, both $V_{CE}(QF)$ and $V_{CE}(QG)$ are a function of $V_{IN}$. This will cause the gain of QF and QG to vary, again causing distortion.

Problem 5. When the S&H switches from track to hold, transistor QH is turned on. As it is turned on, its base current goes from zero to some finite value. This $\Delta I_B(QH)$ will be supplied from current source $I_F$ which means that the output of QG will see a current change of $\Delta I_B(QH)$. This current change will produce a small error voltage at the output $V_{OUT}$.

Problem 6. As the S&H switches from hold to sample, we find that node $N_B$ goes from a low impedance state QH(on) to a higher impedance state temporarily while QH is turning off and QK has not yet begun to conduct. While in this high impedance state, QF remains off. As QE is turned on, node $N_C$ is pulled negative, even so far as to possibly put QE in saturation. This "spike" or "glitch" lasts as long as it takes $N_C$ to fully charge up and QF to turn on. This negative going "spike" or "glitch" not only causes the S&H to take longer to settle, especially if QE saturates, but the "glitch" also impacts the circuits that follow the S&H when used in the context of a feed forward ADC. These following circuits will take longer to recover from the large negative excursions. This circuit imperfection causes delay in the overall speed of conversion of the ADC.

The errors identified in Problems 1 through 6 described above, while individually rather small, combine to limit the distortion-free dynamic range of conventional sample and hold circuits. The novel approaches taken in accordance with the present teachings to solve each of the six problems identified above will be described below.

Figure 2:
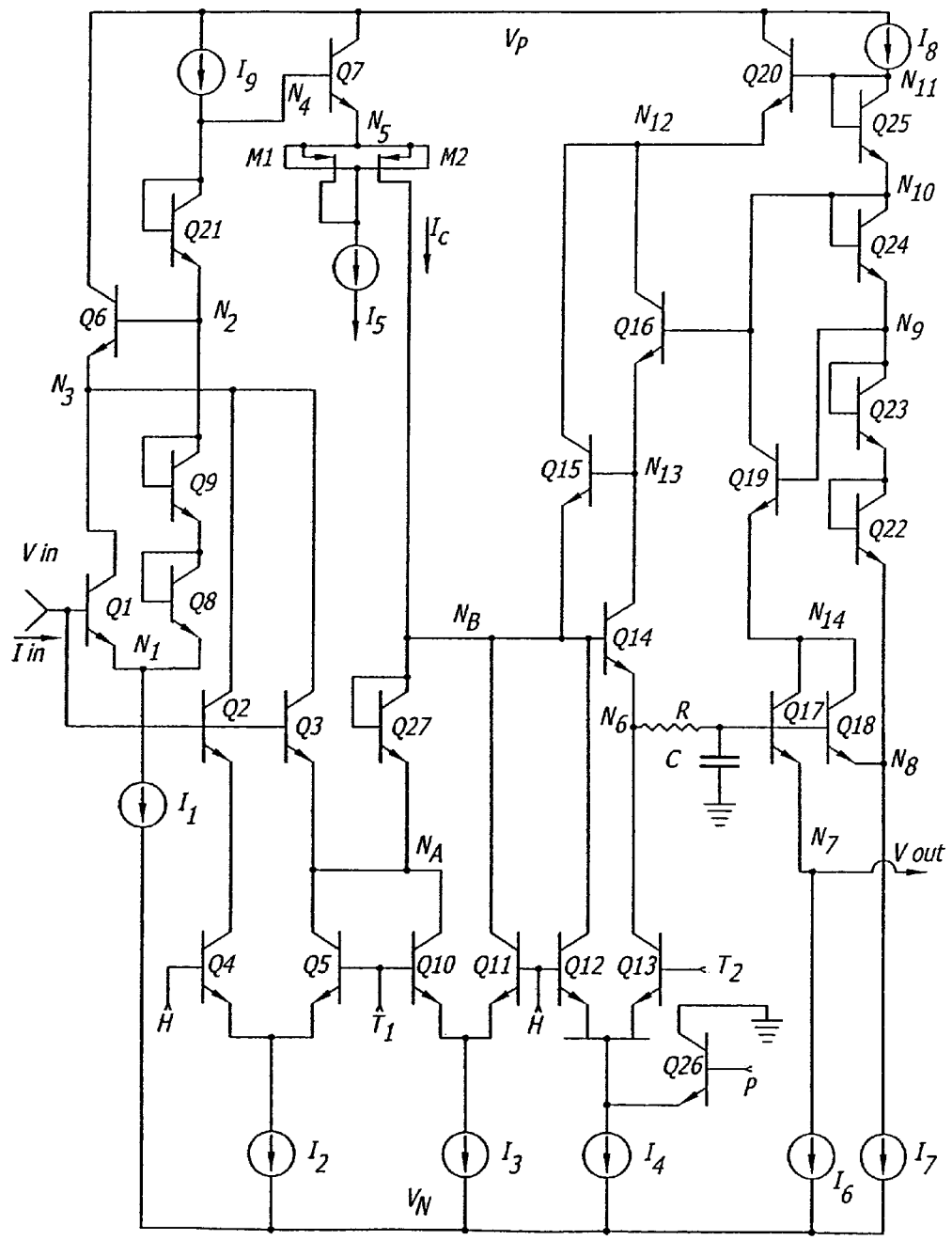
FIG. 2 is a schematic diagram of an improved sample and hold % circuit utilizing open loop bootstrapping in accordance with an illustrative embodiment of the present teachings.

FIG. 2 is a schematic diagram of an improved sample and hold circuit utilizing open loop bootstrapping in accordance with an illustrative embodiment of the present teachings. In FIG. 1, the reference designators are alphabetic such as QA, $I_4$, etc. For clarity, in FIG. 2, the corresponding reference designations are numeric such as Q1, $I_1$, etc.

Solution 1a. In FIG. 2, Q3 has replaced QA as the input transistor and Q4 and Q5 have been added as track to hold switches. Q10 and Q11 replace QB and QC of FIG. 1. Q2 operates in conjunction with Q4 and Q5 to hold the input current, ($I_{IN}$) constant. When the S&H 10 changes from track to hold, Q5 and Q10 turn off. Q4, however, turns on so that as the base current of Q3 goes to zero, the base of Q2 draws current. In essence, $I_{IN}$ is unchanged since it is routed from Q3 to Q2 when the S&H switches from track to hold. When switching from hold to track, $I_{IN}$ is routed from Q2 to Q3 so there is no change to $I_{IN}$. This eliminates the $\Delta I_{IN}$ observed in, connection with FIG. 1 thus solving the first problem discussed above as Problem 1.

Solution 1b. In addition, recall that conventionally, when in the hold mode, the diode-connected transistor QK (now replaced by Q27) would conduct when $V_{IN}$ went more negative than −0.8V from its hold voltage. Now, since both Q5 and Q10 are off in the hold mode, neither Q3 nor Q27 will conduct regardless of the amount of negative excursion of $V_{IN}$. Therefore, $V_{IN}$ is limited only by the switching voltage on the H input of Q4, which can be made as negative as needed. The track to hold voltage is typically −2 V to −2.8 V. Therefore, $V_{IN}$ can be extended from +/−0.4 V in the prior art to +/−2.0 V with this improvement to the input circuit using the exemplary values set forth above.

Solutions to Problems 1 and 6 are disclosed and claimed in U.S. patent application Ser. No. 60/495,766, entitled 14-BIT SAMPLE AND HOLD, filed on Aug. 14, 2003 by the present Applicants, the teachings of which are hereby incorporated herein by reference. Since the solutions to problems 2, 3, and 4 (Solutions 2, 3, and 4 below) rely on various forms of "bootstrapping," we will first describe some basic bootstrapping techniques. Once can employ either feed forward or feedback networks. See FIGS. 3A and 3B for an example of feed forward and feedback boostrapping.

Figure 3A:
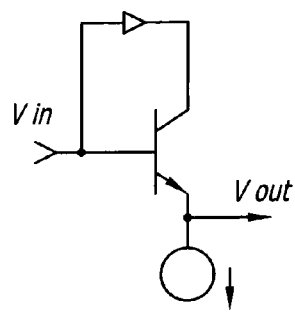
FIG. 3A is a representation of open loop feed forward bootstrapping in accordance with conventional teachings.
Figure 3B:
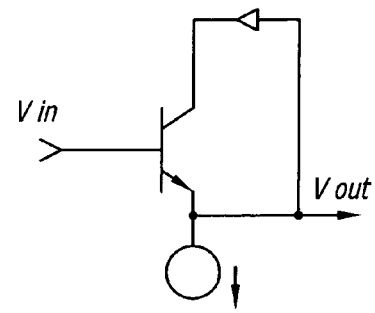
FIG. 3B is a representation of open loop feedback bootstrapping in accordance with conventional teachings.

FIG. 3A is a representation of open loop feed forward bootstrapping in accordance with conventional teachings. FIG. 3B is a representation of open loop feedback bootstrapping in accordance with conventional teachings. The bootstrapping employed can be either open loop or closed loop. The selection of which to choose is a tradeoff that involves many elements including accuracy of feedback, required speed in settling, power, input signal type (pulsed or sine wave), layout and delays. With respect to accuracy, using a closed loop bootstrap circuit improves the accuracy of the bootstrap as a result of the loop gain. The closed loop circuit is internally compensated and doesn't require an RC rolloff. As a result, the closed loop bootstrap is slower than the open loop implementation from an AC and settling perspective. Thus the closed loop bootstrap is more appropriate for DC and sine waves, and the open loop bootstrap performs better for pulse mode applications.

We will first describe an implementation that utilizes open loop techniques. Closed loop implementation will be described following the discussion of Solution 4. Because of the extremely wideband nature of open loop implementation, stability can be a problem. Therefore, a rolloff network may need to be employed to ensure stability of the network especially as the $f_t$ of the technology increases. See FIG. 4 for an example of a feedback bootstrap network with an external RC rolloff.

Figure 4:
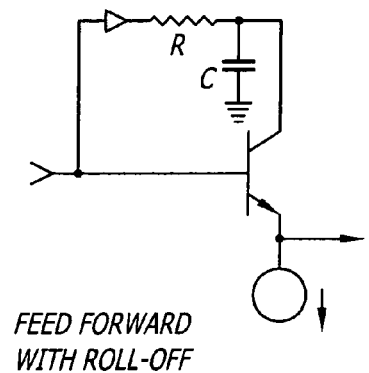
FIG. 4 is a schematic illustrating open loop feed forward bootstrapping with RC roll off in accordance with conventional teachings.

FIG. 4 is a schematic illustrating open loop feed forward bootstrapping with RC rolloff in accordance with conventional teachings. For clarity, the rolloff networks are not shown on FIG. 2 as their values and placements will be a function of the technology employed. Another circuit innovation employed in this invention is that of adding a dummy leg to isolate sensitive circuit nodes. Typically, bootstraps are implemented in one of two ways, either as circuits—that are part of the signal path or as dummy legs that are off of the signal path. The optimal implementation depends on circuit and circuit performance requirements. In FIG. 2, Q1 and Q18 provide this function. See FIGS. 5A and 5B for an implementation of a dummy leg.

Figure 5A:
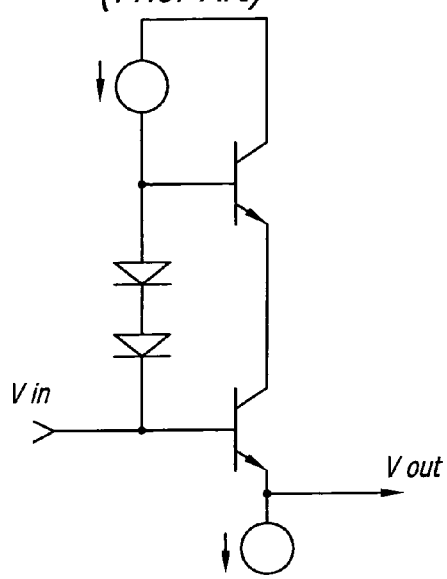
FIG. 5A is a schematic of open loop feed forward with no dummy leg in accordance with conventional teachings.
Figure 5B:
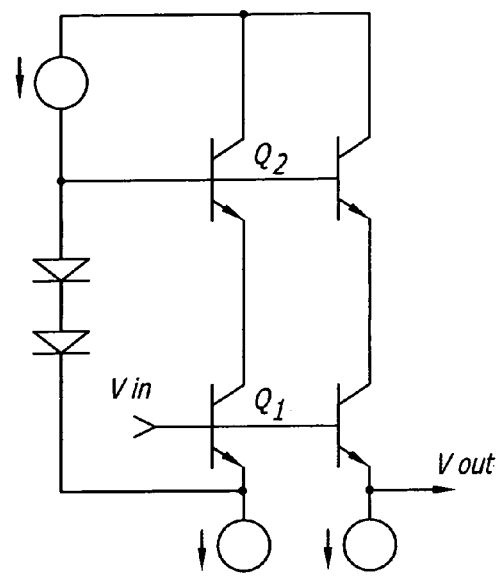
FIG. 5B is a schematic of open loop bootstrapping with a dummy leg in accordance with the present teachings.

FIG. 5A is a schematic of open loop feed forward with no dummy leg in accordance with conventional teachings. FIG. 5B is a schematic of open loop bootstrapping with a dummy leg in accordance with the present teachings. The Q1 dummy leg provides isolation for the feedback and feed forward bootstraps of Solutions 2 and 3 respectively. The Q18 dummy leg provides isolation for the feedback bootstrapping for Solution 4 as well as isolation of Q15's base current changes from the output.

Figure 6A:
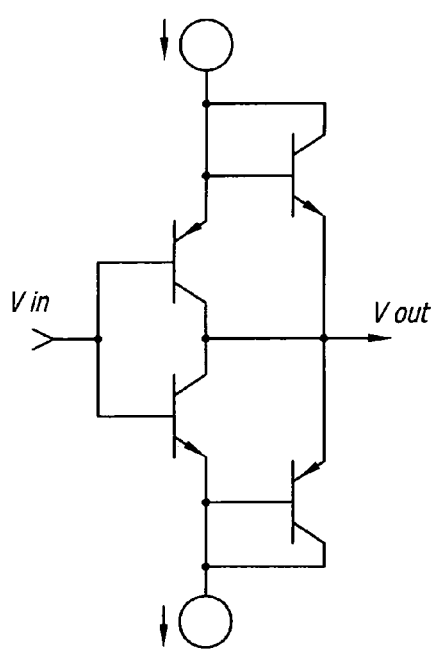
FIG. 6A shows an illustrative implementation of a complimentary bipolar driver in accordance with the teachings of the present invention.

FIG. 6A shows an illustrative implementation of a complimentary bipolar driver in accordance with the teachings of the present invention. In accordance with the present teachings, the feed forward open loop bootstrap concept can be used without the dummy leg and the transistors can be combined in the unique structure described below. Those skilled in the art will appreciate that one can rationally add extra buffers and isolation structures to deal with signal currents, reverse bias on the collector-bases of the NPN and PNP transistors in the signal path. For this bootstrapping scenario, the DC linearity of the circuit shown is limited by the finite output impedance of the current sources.

Figure 6B:
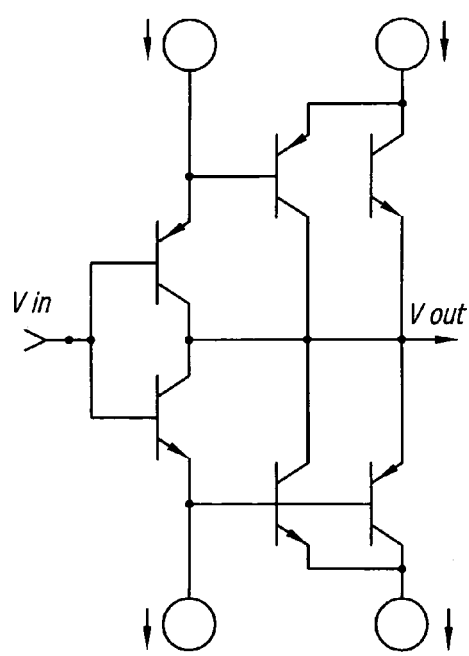
FIG. 6B shows an illustrative implementation of a complimentary bipolar driver with Darlington output in accordance with the teachings of the present invention.

FIG. 6B shows an illustrative implementation of a complimentary bipolar driver with Darlington output to improve the linearity of the circuit in accordance with the teachings of the present invention.

Solution 2. Conventionally, $V_{CE}(QA)$ varied with $V_{IN}$, which caused distortion. In the improved circuit, QA is replaced by Q3. $V_{CE}(Q3) = VN_3 - V_{IN} - V_{BE}(Q3)$ where $VN_3 = V_{IN} - V_{BE}(Q1) + V_{BE}(Q8) + V_{BE}(Q9) - V_{BE}(Q6) = V_{IN} - 0.8V + 0.8V + 0.8V - 0.8V$. Therefore $VN_3 = V_{IN}$ so $V_{CE}(Q3) = VN_3 - V_{IN} + V_{BE}(Q3)$ or $V_{CE}(Q3) = V_{IN} - V_{IN} + 0.8V = 0.8V$, no longer a function of $V_{IN}$. We now see that the added circuitry, specifically Q1, Q8, Q9 and Q6 provides feedback bootstrapping to hold the collector/emitter voltage of Q3 constant, therefore eliminating the problem of gain variation as described above in connection with Problem 2.

For ease of understanding, the previous and following analyses are simplified in that they ignore the fact that the gain through an emitter follower is not exactly unity. The open loop bootstrapping limited the effect of $V_{IN}$ on $V_{CE}(Q3)$ in that it has reduced it by 40 db or more, thereby reducing the impact of the Early effect by that amount. This is often more than adequate for the intended application. When it is not, and a greater reduction of the errors caused by the Early effect is needed, a closed loop implementation would be used. The closed loop approach will be discussed following the description of Solution 4.

Solution 3. The voltage across current mirror MA and MB in FIG. 1 varies with $V_{IN}$ since $V_{SD}(MB) = V_P - VN_B$ and since $VN_B = V_{IN}$, $V_{SD}(MB) = V_P - V_{IN}$. This, as described earlier, causes the current $I_C$ to vary which, in turn, causes voltage variations in the linear signal path and therefore distortion. The current sourced by MB will vary as a function of its source to drain voltage due to channel length modulation. This effect is analogous to the Early effect found in bipolar transistors. By utilizing feed forward bootstrapping to hold the source to drain voltage constant across M2

(in FIG. 2), we eliminate this source of current modulation as the following analysis will show. The solution takes advantage of the added circuitry, specifically Q1, Q8, Q9, Q21 and Q7 described in Solution 2. Q7 is also added. Referencing FIG. 2 we see that $VN1=VIN-0.8V$, $VN2=VN1+1.6V$, $VN_4=VN_2+0.8V$ and $VN_5=VN_4-0.8V$. The voltage across M2 is now:

$$V_{SD}(M2) = VN_5 - VN_B \text{ where } VN_B = V_{IN}.$$
$$V_{SD}(M2) = VN_5 - V_{IN} = (VN_4 - 0.8 \text{ V}) - V_{IN}$$
$$= (VN_2 + 0.8 \text{ V}) - 0.8 \text{ V} - V_{IN}$$
$$= (VN_1 + 1.6 \text{ V}) + 0.8 \text{ V} - V_{IN}$$
$$= (V_{IN} - 0.8 \text{ V}) + 1.6 \text{ V} + 0.8 \text{ V} - 0.8 \text{ V} - V_{IN}$$
$$= 0.8 \text{ V}, \text{ no longer a function of } V_{IN}.$$

Therefore the prior art problem 3 has been addressed.

It should be noted that current source $I_9$ (if implemented as a PMOS mirror) would experience channel length modulation which would cause its output impedance to vary. However, it is not in the signal path therefore, its influence on the signal path is much reduced over a current source ($M_1$ and $M_2$) that is directly connected to the signal path.

Solution 4. Returning to FIG. 2, note that Q14 and Q17 in the improved implementation perform the same functions as QF and QG in FIG. 1. In connection with FIG. 1, it was noted that the $V_{CE}s$ of QF and QG varied as $V_{IN}$ varied. The inventive implementation set forth below is designed to hold the collector to emitter voltages of Q14 and Q17 constant, as shown by the following analysis.

Recall $VN_B=V_{IN}$. Now, $VN_6=VN_B-0.8V$, $VN_7=VN_6-0.8V$, $VN_8=VN_7$, $VN_9=VN_8+1.6V$, $VN_{10}=VN_9+0.8V$, $VN_{11}=VN_{10}+0.8V$, $VN_{12}=VN_{11}-0.8V$ and $VN_{13}=VN_{10}-0.8V$.

Now, to show that $V_{CE}(Q14)$ and $V_{CE}(Q17)$ are independent of $V_{IN}$:

$V_{CE}(Q14)=VN_{13}-VN_6$ substituting we have:

$$V_{CE}(Q14) = (VN_{10} - 0.8 \text{ V}) - (VN_B - 0.8 \text{ V})$$
$$= (VN_9 + 0.8 \text{ V}) - 0.8 \text{ V} - (V_{IN} - 0.8 \text{ V})$$
$$= (VN_8 + 1.6 \text{ V}) + 0.8 \text{ V} - 0.8 \text{ V} - V_{IN} + 0.8 \text{ V}$$
$$= (VN_6 - 0.8 \text{ V}) + 1.6 \text{ V} + 0.8 \text{ V} - 0.8 \text{ V} - V_{IN} + 0.8 \text{ V}$$
$$= (VN_B - 0.8 \text{ V}) - 0.8 \text{ V} + 1.6 \text{ V} + 0.8 \text{ V} - 0.8 \text{ V}$$
$$\quad - V_{IN} + 0.8 \text{ V}$$
$$= V_{IN} - 0.8 \text{ V} - 0.8 \text{ V} + 1.6 \text{ V} + 0.8 \text{ V} - 0.8 \text{ V}$$
$$\quad - V_{IN} + 0.8 \text{ V}$$

Collecting terms, we have:

$V_{CE}(Q14)=0.8V$, independent of $V_{IN}$.

The analysis of $V_{CE}(Q17)$ is similar and can be shown to be:

$V_{CE}(Q17)=+0.8V$ also independent of $V_{IN}$. Therefore the prior art problem is addressed.

The concepts and benefits of closed loop implementations of bootstrapping are discussed below. If FIG. 3A is redrawn as shown in FIG. 7, the concept of a closed loop bootstrapping approach is illustrated.

Figure 7:
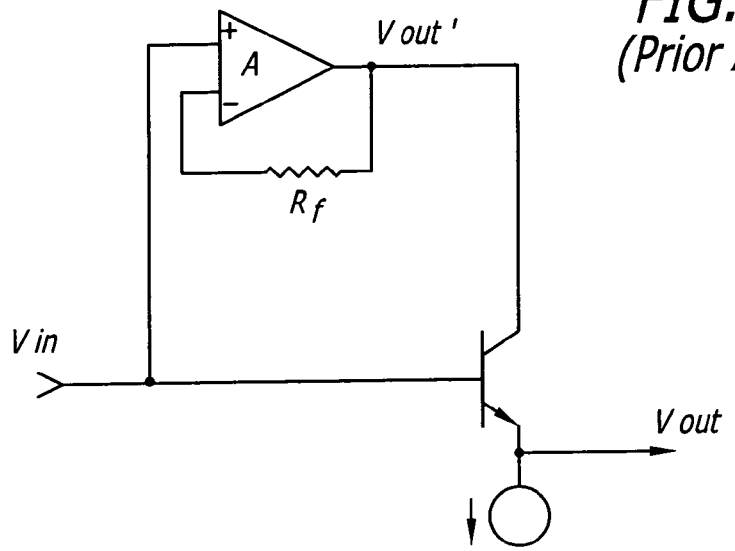
FIG. 7 is a schematic representation of closed loop feed forward bootstrapping in accordance with conventional teachings.

FIG. 7 is a schematic representation of closed feed forward bootstrapping in accordance with conventional teachings. As previously stated, a closed loop bootstrap is not as wideband as an open loop approach. The loop is internally compensated and will require no external compensation. This approach allows the bootstrap gain, A, to approach unity as a result of the loop gain of the closed loop open amplifier (the voltage at $V_{OUT}'$ is virtually equal to $V_{IN}$). This then will even further minimize the errors due to the Early effect, reducing the error due to the Early effect from −40 dB (open loop) to greater than −60 dB (closed loop). An example of a closed loop amplifier is shown in FIG. 8.

Figure 8:
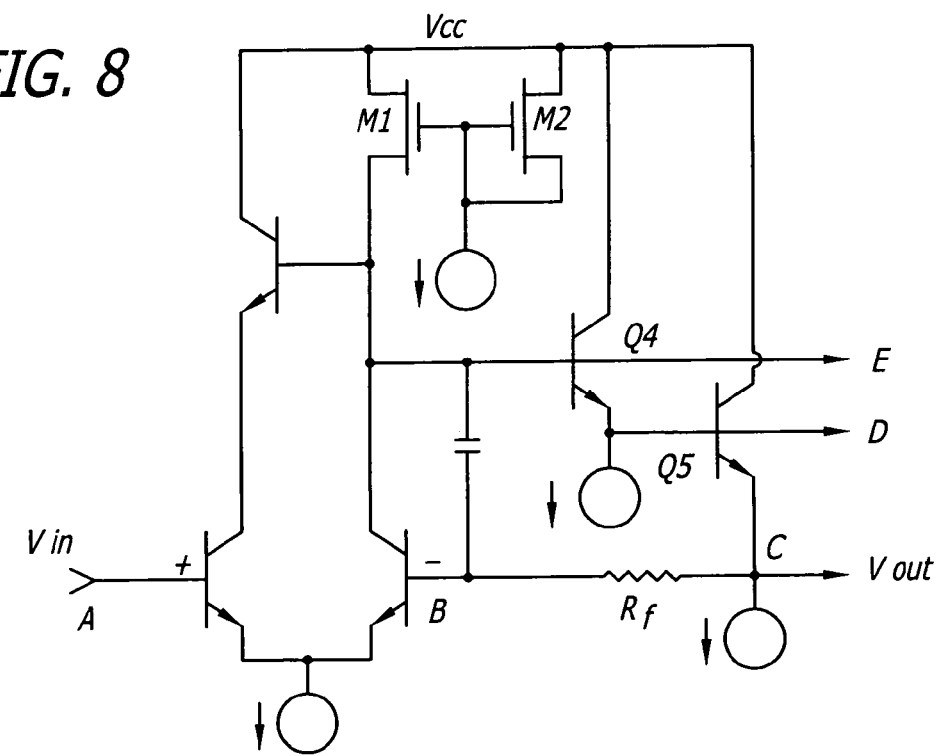
FIG. 8 is a schematic of a closed loop bootstrap amplifier with multiple taps in accordance with an illustrative embodiment of the present teachings.
Figure 9:
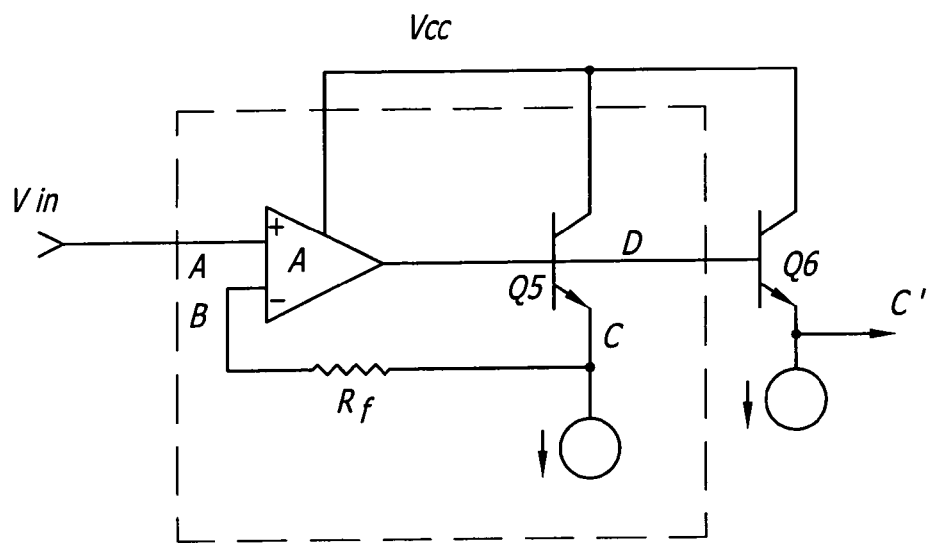
FIG. 9 is a schematic of closed loop bootstrap amplifier with single tap and external emitter follower in accordance with an illustrative embodiment of the present teachings.

FIG. 8 is a schematic of a closed loop bootstrap amplifier with multiple taps in accordance with an illustrative embodiment of the present teachings. Note that various points within the amplifier can be used as taps to provide appropriate bootstrap voltage levels to the circuit as well as accurate gains. When buffered by external emitter followers that are outside the loop, the voltage at the tap points are much closer to unity than an open loop bootstrap structure. Further, as the bootstrap gain approaches unity, the nonlinear Early effect error is reduced. FIG. 9 provides insight into this concept.

FIG. 9 is a schematic of closed loop bootstrap amplifier with single tap and external emitter follower in accordance with an illustrative embodiment of the present teachings.

Figure 10:
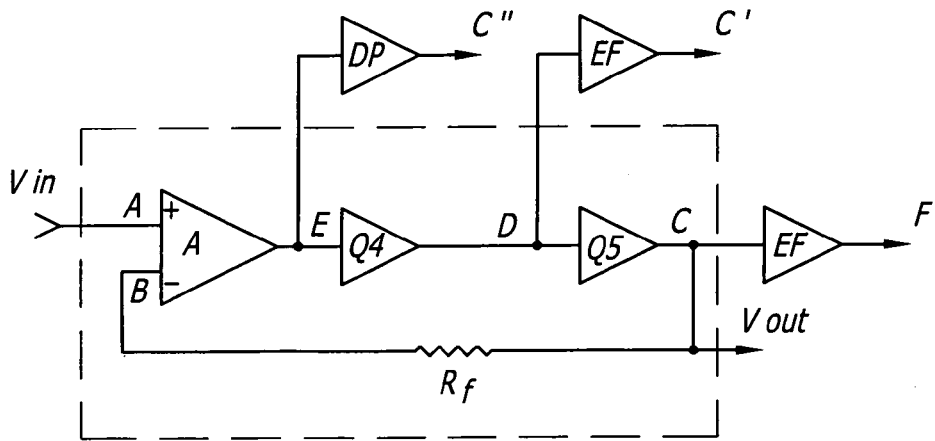
FIG. 10 is a simplified representation of closed loop bootstrap amplifier showing multiple taps with emitter followers and Darlington pairs in accordance with an illustrative embodiment of the present teachings.

FIG. 10 is a simplified representation of closed loop bootstrap amplifier showing multiple taps with emitter followers and Darlington pairs in accordance with an illustrative embodiment of the present teachings.

Referring to FIG. 9, it is well known that for a closed loop amplifier A, with reasonable gain, the voltage at point C is almost exactly equal to $V_{IN}$. Now Q5 and Q6 are closely matched and their gains are almost equal, not unity, but almost equal. Therefore, even though Q6 is outside the loop, since both transistors are driven by point D the voltage at C and C' are almost identical. So the gain from $V_{IN}$ to C' or C is almost unity. Taking this one step further and referring to FIG. 8 and FIG. 10 which is a simplified structure that embodies the above concepts where EF=emitter followers and DP=Darlington pairs, we see that if we connect an external Darlington pair to point E then (reference FIG. 10) the output of DP, (C'') will be almost identical to $V_{IN}$ as well. Therefore, this scheme allows internal points of the closed loop amplifier to be tapped and used to provide very accurate feedback, approaching unity, to be used as bootstrap voltages.

Figure 11:
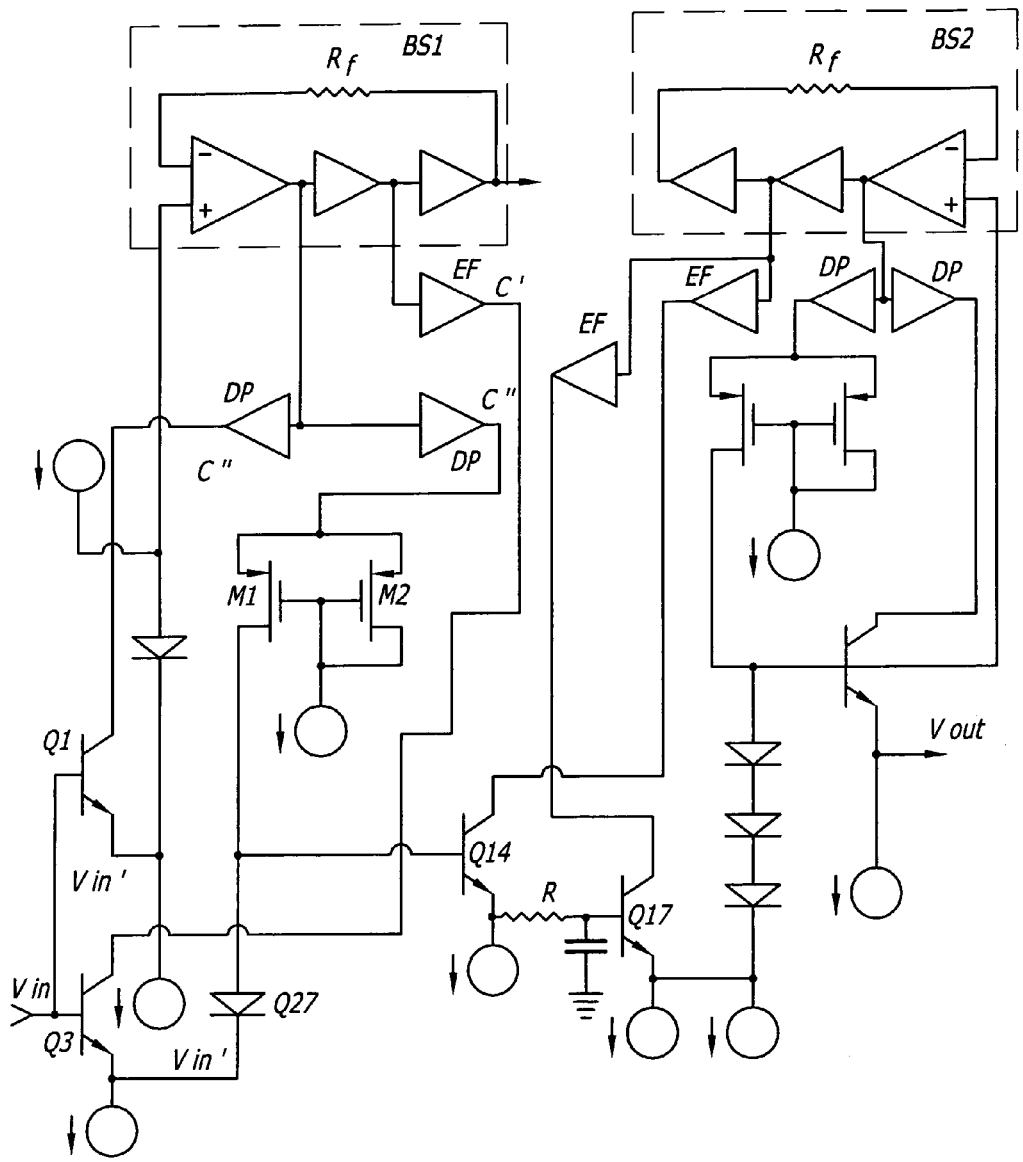
FIG. 11 is a schematic diagram of S&H utilizing closed loop bootstrapping in accordance with an illustrative embodiment of the present teachings.

FIG. 11 is a schematic diagram of S&H utilizing closed loop bootstrapping in accordance with an illustrative embodiment of the present teachings. Drawing on the previous analysis, we will briefly describe how this circuit functions from an AC gain perspective. The voltage at the emitters of Q1 and Q3 are virtually equal since the transistors are well matched. Let this voltage=$V_{IN}'$. We see that the input to BS1=$V_{IN}'$ therefore the outputs of the emitter follower (EF) which is shown as C' is also equal to $V_{IN}'$ and the outputs of the Darlington pairs (DP) C'' are also equal to $V_{IN}'$. This being true we see that the $V_{CE}$(Q1) and $V_{CE}$(Q3) are equal to $V_{IN}'-V_{IN}'=0$ from an AC perspective. The same argument can be made for current source M1, M2.

An analysis of BS2 provides similar results for the transistors and current sources that are in the signal path.

Solution 5. Recall that one problem with respect to the conventional implementation of FIG. 1 involved a change in QH base current being reflected into the output through QJ and QI. In accordance with the present teachings, as illustrated in FIG. 2, we shall first show that Q15 functions as per QH, i.e. clamping NB at the same potential as $N_6$ when in the hold mode. We will then show that the Q15 Δ base current is isolated from the output.

We know that in track mode: $VN_B=V_{IN}$ and $VN_6=V_{IN}-0.8V$. We also know that $VN_{13}=VN_B$ in the track mode.

Therefore $V_{BE}(Q15)=VN_{13}-VN_B=VN_B-VN_B=0$ and Q15 is off, as it was in the prior art. When the S&H switches to the hold mode and Q11 and Q12 are switched on and Q13 switched off and since $VN_{13}=VN_6+0.8V$ when Q15 turns on $N_B$ is clamped at the voltage $VN_B=VN_{13}-0.8V$ or $VN_B=(VN_6+0.8V)-0.8V$ or $VN_B=VN_6$ turning Q14 off allowing C to store the sampled voltage. This is the same as in FIG. 1.

Having shown that the circuit performs as before, we will now trace the Q15 base current as it was switched on. Q16 has been added and now forms a Darlington pair with Q15. The Q15 base current flows through Q16 and Q20. Their base currents come in turn from $I_8$ which will cause a current delta in the chain $I_8$, Q25, Q24, Q23, Q22 and Q18. However, we observe that Q17 is independent of this circuit in that the output voltage $V_{OUT}$ is in a separate path and therefore no longer affected by the $\Delta I_B Q_{15}$ current. This isolation is provided by a dummy leg circuit. The dummy leg will provide isolation for the output. Q18 provides this dummy leg function in the invention. This implementation isolates N6 for the Δ base current of Q15 by a factor of $\beta^2$ as it relates through Q16 and Q18. Hence, the problem 5 existing in the prior art has been addressed.

Solution 6. Q26 is added to eliminate the large negative "glitch" or "spike" created when the S&H is switched from hold to sample. This circuit functions by allowing Q13 to be turned on later, after Q27 has begun conducting again and $N_B$ is in a low impedance state. See FIG. 12 for a timing diagram.

Figure 12:
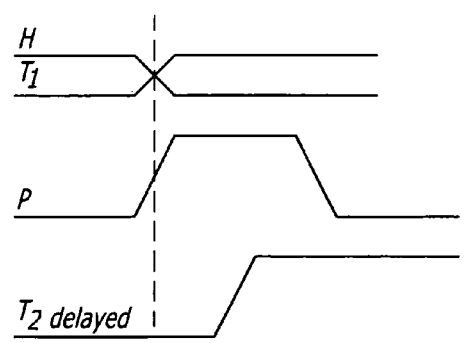
FIG. 12 is a timing diagram illustrative of an operation of a sample and hold circuit implemented in accordance with the present teachings.

FIG. 12 is a timing diagram illustrative of an operation of a sample and hold circuit implemented in accordance with the present teachings. When Q12 is switched off, Q26 is switched on with a short pulse P. After $N_B$ is stabilized, Q13 is turned on with a delayed signal T2 and Q26 is turned off. Now, as Q13 turns on, Q14 is able to charge Node $N_6$ to the value of $N_B-V_{BE}(Q14)$ without the large negative glitch present in the prior art.

FIG. 2 embodies the improvements and solutions described herein. In summary, the S&H input current is held constant and Q27 is held in a non-conducting state for larger swings of $V_{IN}$ when the S&H is in the hold mode. All transistors and current sources that can affect the forward signal path in the track mode are held with constant collector to emitter voltages (or drain to source voltage in the case of the current source implemented by M1 and M2). The switching current needed by Q15 when the S&H switches to hold is isolated from the signal path. Lastly, the negative glitch occurring at Node $N_6$ has been eliminated. These, taken together, and as shown in FIG. 2 significantly improve the dynamic range, linearity and distortion of the prior art implementation.

TABLE 1

Illustrative Values for FIG. 2

| | |
|---|---|
| $V_P$ | +5 V |
| $V_N$ | −5 V |
| $I_1$ | 2 MA |
| $I_2$ | 2 MA |
| $I_3$ | 2 MA |
| $I_4$ | 2 MA |
| $I_5$ | 1 MA |
| $I_6$ | 5 MA |
| $I_7$ | 3 MA |
| $I_8$ | 2 MA |
| $I_9$ | 1 MA |
| $I_C$ | 1 MA |
| C | 5 picofarads |
| R | Selected to optimize the tradeoff between S&H bandwidth and distortion |

In short, the invention is targeted to improve-dynamic accuracy, linearity and settling time, thereby lowering the distortion products generated and improving the speed, of conventional sample and hold implementations through the provision of several solutions including:

The circuit structure of Solution 1 should minimize the change in the input transistor's base current when the circuit switches from track to hold or hold to track. The settling time of the circuit should be improved as any current transients on the input will impact the driving circuit, which is often a narrow band filter. In addition, it should increase the hold mode isolation thereby increasing the input dynamic range allowing distortion-free operation over a larger input negative voltage swing than per the designs of the prior art. It will do so by keeping QK of FIG. 1 in the 'off' state when the S&H is in the hold mode.

The implementation of Solution 2 should hold the collector emitter, (VCE) voltage constant at the input transistor. This should improve gain accuracy and linearity over the prior art where VCE is allowed to vary. The implementation of Solution 3 should increase the dynamic current accuracy of the current mirror (M1 and M2) for diode connected transistor QK, by holding M2's source to drain voltage, VSD, constant. This should keep the current in the PMOS current source constant so that it does not vary as a function of $V_{IN}$ thereby modulating the input signal. This should improve the accuracy and linearity of the S&H over the teachings of the prior art.

The implementation of Solution 4 should hold VCE constant for both QF and QG resulting in improved gain accuracy and linearity. In the prior art, VCE was allowed to vary with the input signal.

The implementation of Solution 5 adds, a separate circuit (dummy leg) that should effectively isolate the output voltage, VOUT, from the switching transients that occur when QH is turned on at the transition from track to hold.

The implementation of Solution 6 should minimize the negative going "glitch" that occurs at NC when the S&H switches from hold to track. By eliminating this glitch, the S&H speed of settling and its accuracy should be improved.

Thus, the present invention has been described herein with reference to a particular embodiment for a particular application. Those having ordinary skill in the art and access to the present teachings will recognize additional modifications, applications and embodiments within the scope thereof. For example, the invention is not limited to any particular transistor technology. Bipolar, field-effect and other technologies may be used without departing from the scope of the present teachings.

It is therefore intended by the appended claims to cover any and all such applications, modifications and embodiments within the scope of the present invention.

Accordingly,

What is claimed is:

1. A sample and hold circuit comprising:
    first means for receiving an input current, said first means including a first transistor wherein the input current is received via the base of the first transistor;
    second means for sampling and for holding said input current, said second means switching from a sampling mode for sample said input current to a holding mode for holding said input current in response to a control signal, said second means including a second transistor; and
    third means for stabilizing said input current as said second means switches from a sampling mode to a hold mode thereof in response to said control signal, said third means including a third transistor, a fourth transistor, and a fifth transistor, wherein the base of the third transistor receives the input current, wherein the emitters of the third transistor and the first transistor are operatively coupled to the collectors of the fourth transistor and the fifth transistor, respectively, and wherein the emitters of the fourth transistors and the fifth transistor are commonly coupled to a current source, and wherein, during the switching of a sample mode to a hold mode by said second means, said third means stabilizes the input current by charging the base current of the third transistor while the base current of the first transistor is discharging.

2. The invention of claim 1 wherein the base of said second transistor of the second means is operatively coupled to the collector of said fifth transistor of the third means.

3. The invention of claim 2, further including means for adding feedback bootstrapping for holding constant a voltage across the output terminals of said first transistor.

4. The invention of claim 3 wherein said means for adding feedback bootstrapping includes a dummy leg.

5. A sample and hold circuit comprising:

first means for receiving an input signal, said first means including a first transistor, wherein the input signal is received via the base of the first transistor;

second means for sampling and for holding said input signal, said second means switching from a sampling mode for sample said input signal to a holding mode for holding said input signal in response to a control signal, said second means including a second transistor;

a current mirror coupled to said first and said second means; and means for minimizing voltage variations in a linear signal path of said sample and hold circuit, said means for minimizing voltage variations including a plurality of bootstrapping transistors that are bootstrapped with respect to the input signal.

6. The invention of claim 5 wherein said means for minimizing voltage variations includes a feed forward bootstrapping arrangement with respect to said current mirror, wherein at said plurality of bootstrapping transistors each having the base connected to the collector.

7. A sample and hold circuit comprising:

first means for receiving an input signal, said first means including a first transistor, wherein the input signal is received via the base of the first transistor;

second means for sampling and for holding said input signal, said second means switching from a sampling mode for sample said input signal to a holding mode for holding said input signal in response to a control signal, said second means including a second transistor; and third means for stabilizing a signal path of said sample and hold circuit, said means for stabilizing including a closed loop bootstrapping arrangement having a plurality of operational amplifiers.

8. A sample and hold circuit comprising:

first means for receiving an input signal, said first means including a first transistor, wherein the input signal is received via the base of the first transistor;

second means for sampling and for holding said input signal, said second means switching from a sampling mode for sample said input signal to a holding mode for holding said input signal in response to a control signal, said second means including a second transistor; and third means for stabilizing an output signal of an output circuit of said sample and hold circuit, said means for stabilizing the output including a clamping arrangement coupled to an output path of said output circuits, wherein said means for stabilizing the output includes means for providing isolation of said output signal with respect to a change in base current supplied to at least one transistor in a Darlington pair.

9. The invention of claim 8 wherein said means for providing isolation includes a dummy leg.

10. A sample and hold circuit comprising:

a first circuit for receiving an input signal, said first circuit including a first transistor, wherein the input signal is received via the base of said first transistor;

a second circuit for sampling and for holding said input signal, said second circuit switching from a sampling mode for sample said input signal to a holding mode for holding said input signal in response to a control signal, said second means including a second transistor; and a third circuit for stabilizing said input signal as said second circuit from a sampling mode to a hold mode thereof in response to said control signal , said third circuit including a third transistor, a fourth transistor, and a fifth transistor, wherein the base of the third transistor is operatively coupled to the input signal path; and a fourth circuit for adding feedback bootstrapping to hold constant a voltage across the output terminals of said first transistor, said fourth circuit including a dummy leg.

11. The sample and hold circuit of claim 10, further comprising a current mirror coupled to said first circuit.

12. The sample and hold circuit of claim 10, wherein the fourth circuit includes a Darlington transistor pair.

* * * * *